(12) United States Patent
Song

(10) Patent No.: US 7,709,322 B2
(45) Date of Patent: May 4, 2010

(54) METHODS FOR FABRICATING FLASH MEMORY DEVICES

(75) Inventor: Jung Gyun Song, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/473,872

(22) Filed: May 28, 2009

(65) Prior Publication Data

US 2009/0233432 A1 Sep. 17, 2009

Related U.S. Application Data

(62) Division of application No. 10/902,543, filed on Jul. 29, 2004, now Pat. No. 7,566,616.

(30) Foreign Application Priority Data

Jul. 31, 2003 (KR) .................. 10-2003-0052944

(51) Int. Cl.
*H01L 21/336* (2006.01)

(52) U.S. Cl. ...................................... 438/257; 438/260

(58) Field of Classification Search .................. 438/257, 438/260, 266; 257/E29.129
See application file for complete search history.

(56) References Cited

U.S. PATENT DOCUMENTS

| 5,637,896 A | 6/1997 | Huang |
| 5,801,415 A | 9/1998 | Lee et al. |
| 6,242,303 B1 | 6/2001 | Wang et al. |
| 6,969,653 B2 * | 11/2005 | Jwa ............................ 438/260 |

FOREIGN PATENT DOCUMENTS

KR  10-2002-0014274 A  2/2002

* cited by examiner

*Primary Examiner*—Jack Chen
(74) *Attorney, Agent, or Firm*—Saliwanchik, Lloyd & Saliwanchik

(57) ABSTRACT

Methods for fabricating flash memory devices are disclosed. A disclosed method comprises: forming a polysilicon layer on a semiconductor substrate; injecting dopants having stepped implantation energy levels into the polysilicon layer; forming a photoresist pattern on the polysilicon layer; and etching the polysilicon layer to form a floating gate.

7 Claims, 4 Drawing Sheets

METHODS FOR FABRICATING FLASH MEMORY DEVICES

CROSS-REFERENCE TO RELATED APPLICATIONS

This application is a divisional of U.S. application Ser. No. 10/902,543, filed Jul. 29, 2004 now U.S. Pat. No. 7,566,616, which claims the benefit of Korean Application No. 10-2003-0052944, filed Jul. 31, 2003, which are hereby incorporated by reference in their entirety.

FIELD OF THE DISCLOSURE

The present disclosure relates generally to flash memory devices, and more particularly, to methods for fabricating flash memory devices.

BACKGROUND

There are two general categories of flash memories, namely, EPROMs (Erasable Programmable ROMs) and EEPROMs (Electrically Erasable Programmable ROMs). The program and erase operation of an EPROM is performed by charging or discharging its floating gate with ultraviolet rays or X-rays. However, the programming and erase operation of an EEPROM is performed by electrically charging or discharging its floating gate. EEPROMs can be readily updated, even when embedded into a system. Therefore, EEPROMs are employed in many different systems. EEPROMs are generally divided into two categories, namely, a byte removal type and a flash type. The flash type of EEPROMS may again be divided into two types, namely, a hot-electron injection type and an F-N (Fowler-Nordgein) current type.

FIG. 1 is a cross-sectional view illustrating a conventional method for fabricating a floating gate of a flash memory device.

EEPROMs generally store one bit using a transistor. As shown in FIG. 1, such a flash memory device comprises a tunnel gate oxide layer formed on a silicon substrate, a floating gate, an insulating layer on the floating gate (which functions as an isolation layer), and a control gate.

Typically, the voltage for the program and erase operation is applied to the control gate. The voltage applied to the control gate is determined according to the coupling ratio. The coupling ratio is the ratio of the voltage applied to the floating gate to the voltage applied to the control gate. The initial voltage applied to the control gate must be higher than the voltage required to change the state of the floating gate for the program and erase operation to be initiated. Thus, the efficiency of the program and erase operation increases in proportion to the coupling ratio.

Various methods have been provided to increase the coupling ratio. One of the known methods is to enlarge the coupling area between the floating gate and the control gate. For example, in some known methods the floating gate is formed to have a convexo-concave (凹凸)shape which has a larger area than a plane and, thus, enlarges the coupling area. As a result of this known approach, various methods have been provided to form the sidewalls of the floating gate into convexo-concave (凹凸)shapes.

FIG. 2 through FIG. 4 are cross-sectional views illustrating a known method for fabricating a floating gate of a flash memory device as described in Wu, Korean Patent No. 0,376,863.

Referring to FIG. 2, a first oxide layer 3 is formed on an area 2 doped with impurities in a substrate 1. A first nitride layer 4 is then deposited on the first oxide layer 3. A second oxide layer 5 is then formed on the first nitride layer 4. A second nitride layer 6 is then deposited on the second oxide layer 5. The convexo-concave (凹凸)shaped structures are then completed. Next, the gaps between the convexo-concave (凹凸)shaped structures are filled with a material to form floating gates.

Referring to FIG. 3, the second oxide layer 5, and the first and the second nitride layers 4, 6 in the convexo-concave (凹凸)shaped structures are removed by an anisotropic etching process. The floating gates 7 are, thus, completed and have a convexo-concave (凹凸)shape.

Referring to FIG. 4, an ONO (Oxide/Nitride/Oxide) layer or an oxide layer 8 is deposited on the floating gates 7. Control gates 9 are then completed through later processes.

Wang et al., U.S. Pat. No. 6,242,303, describe a method for manufacturing an erasable programmable memory by enlarging the coupling area between the control gate and the floating gate and increasing the capacitive-coupling ratio.

Lee et al., U.S. Pat. No. 5,801,415, describe a method for making an improved electrically programmable ROM device having non volatile memory cells with enhanced capacitive coupling.

Huang, U.S. Pat. No. 5,637,896, describes a process for fabricating an array of floating gate memory devices on a substrate.

The above-mentioned conventional methods for fabricating a floating gate of a flash memory device have several problems. For example, many layers such as the first oxide layer 3, the first nitride layer 4, the second oxide layer 5. and the second nitride layer 6 are required to form the convexo-concave (凹凸)shapes. This requirement results in complexity and cumbersomeness during all of the processes. Second, as the number of the convexo-concave (凹凸)shapes increases in order to enlarge the coupling area, the number of processes for depositing insulating layers such as oxide layers or nitride layers may be increased as well. Moreover, the anisotropic process for forming the convexo-concave (凹凸)shape may cause serious defects in the resulting flash memory devices.

DETAILED DESCRIPTION

The coupling ratio significantly affects the voltage which must be applied to a control gate to perform a program and erase operation. Increasing the coupling ratio decreases the voltage which must be applied to the control gate to deliver the same level of voltage to the floating gate. Thus, the coupling area between the floating gate and the control gate should be enlarged in order to increase the coupling ratio and reduce the voltage that must be applied to the control gate to erase and/or program the EEPROM. However, expanding the size of the floating gate itself may prevent miniaturization of the devices. Hence, a transformation of the shape of the floating gate is required.

$$V_{FG} = \alpha_{CG} V_{CG} \quad \text{[Equation 1]}$$

$$\alpha_{CG} = C_{CG}/C\text{total (where } \alpha_{CG} < 1, C = \text{electrostatic capacitance)} \quad \text{[Equation 2]}$$

$$C_{CG} = \in A/T \text{ (where } \in = \text{dielectric constant}, A. = \text{coupling area}, T = \text{thickness of the dielectric layer)} \quad \text{[Equation 3]}$$

Referring to Equation 1, α is the coupling ratio, α is calculated as the sum of the coupling ratios of the control gate, the insulating layer and the floating gate. The coupling ratio of the control gate is a major element determining the value of α.

Referring to Equation 2, the coupling ratio of the control gate is in direct proportion to the electrostatic capacitance of the control gate.

Referring to Equation 3, the electrostatic capacitance of the control gate is in direct proportion to the coupling area between the floating gate and the control gate and in inverse proportion to the thickness of the dielectric layer.

An example method disclosed herein enlarges the coupling area of the floating gate thereby mainly affecting the value of the electrostatic capacitance of the control gate and, thus, increasing the coupling ratio of the control gate. As the coupling ratio of the control gate increases, the voltage that must be applied to the control gate to apply a desired level of voltage to the floating gate voltage $V_{FG}$ decreases. An efficient program and erase operation of the flash memory device results. The disclosed method achieves this advantage by capitalizing on the fact that the etching rate of doped polysilicon is faster than that of undoped polysilicon.

Figure 1:
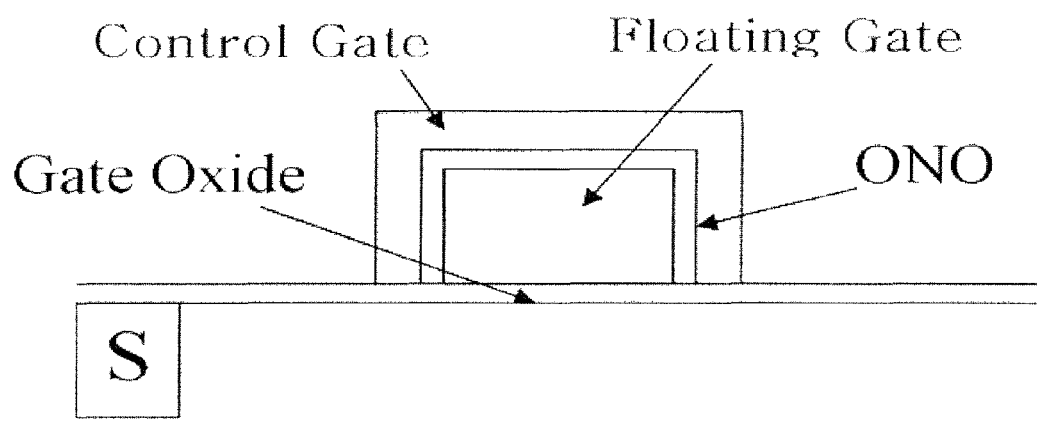
FIG. 1 through FIG. 4 are cross-sectional views illustrating a prior art method for fabricating a flash memory device.
Figure 2:
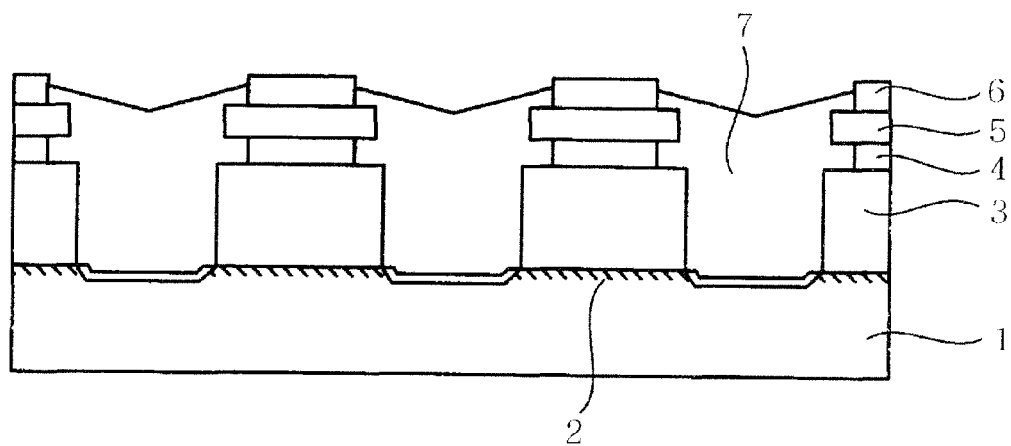
Figure 3:
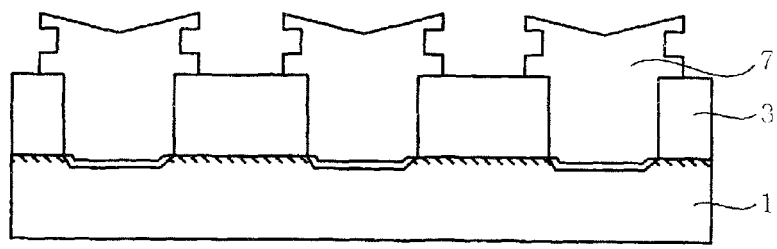
Figure 4:
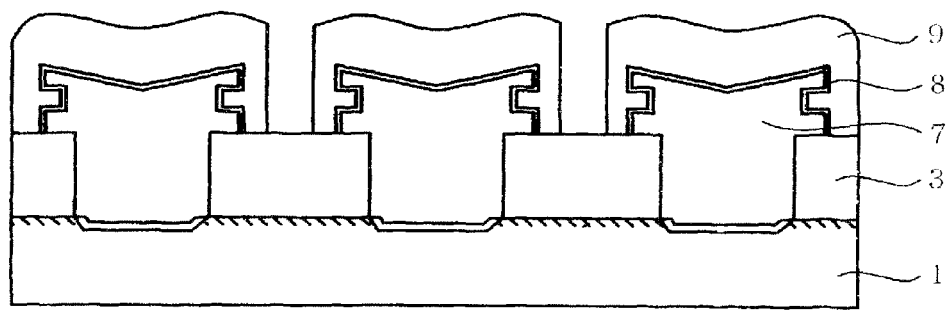
Figure 5:
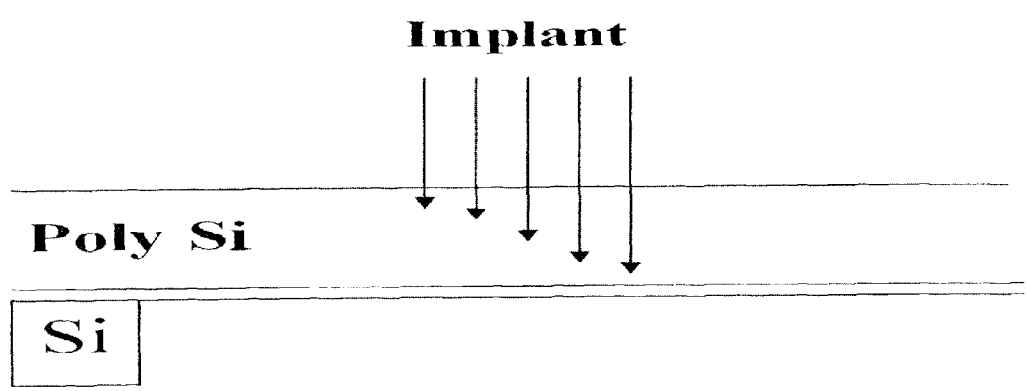
FIG. 5 through FIG. 9 are cross-sectional views illustrating an example method for fabricating a flash memory device constructed in accordance with the teachings of the present invention.

Referring to FIG. 5, in the example method, dopants with stepped implant energy levels are injected. In particular, a gate oxide layer is deposited on a silicon substrate. An undoped polysilicon layer is then formed on the gate oxide layer. Once the number of stepped implantation energy levels is determined, dopants corresponding to the selected levels are injected into the undoped polysilicon layer. The number of stepped implantation energy levels is set to equal the desired number of convexo-concave (凹凸)shapes.

Figure 6:
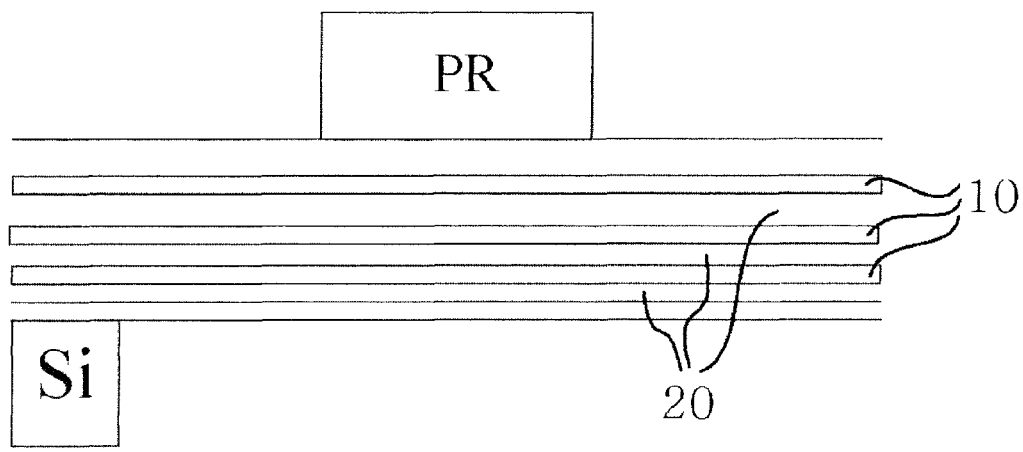

Referring to FIG. 6, doped polysilicon layers 10 and undoped polysilicon layers 20 are alternately and repeatedly formed by the dopant injection process. The number of doped and undoped polysilicon layers 10, 20 linearly increases with the number of stepped implantation energy levels. A photoresist layer is deposited on the top surface of the polysilicon layer containing the doped and undoped polysilicon layers 10, 20. A photoresist pattern for a floating gate is then formed.

Figure 7:
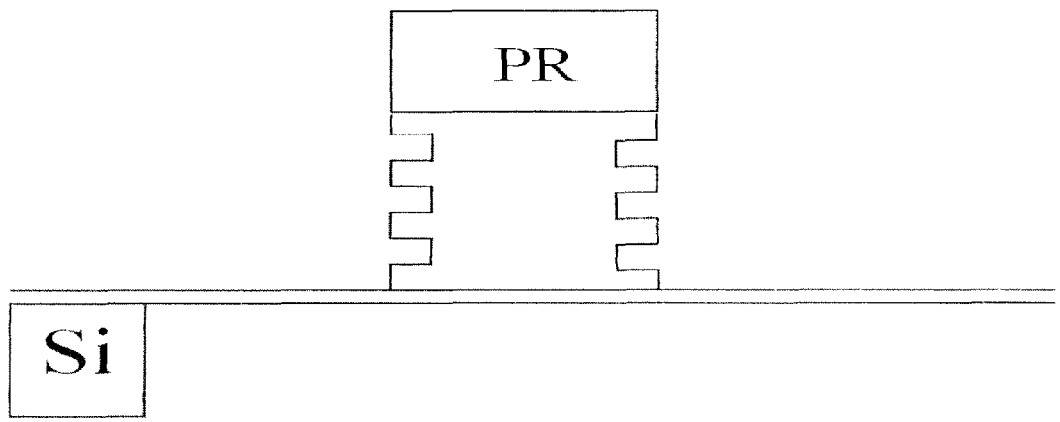

Referring to FIG. 7, convexo-concave (凹凸)shapes are formed in the sidewalks of the floating gate by an etching process. In particular, the convexo-concave (凹凸)shapes are formed because the etching rate of doped polysilicon 10 is faster than that of undoped polysilicon 20. The coupling area is, thus, enlarged by forming the sidewalls of the floating gate with convexo-concave (凹凸)shapes. The dopants are then diffused by a later annealing process.

Figure 8:
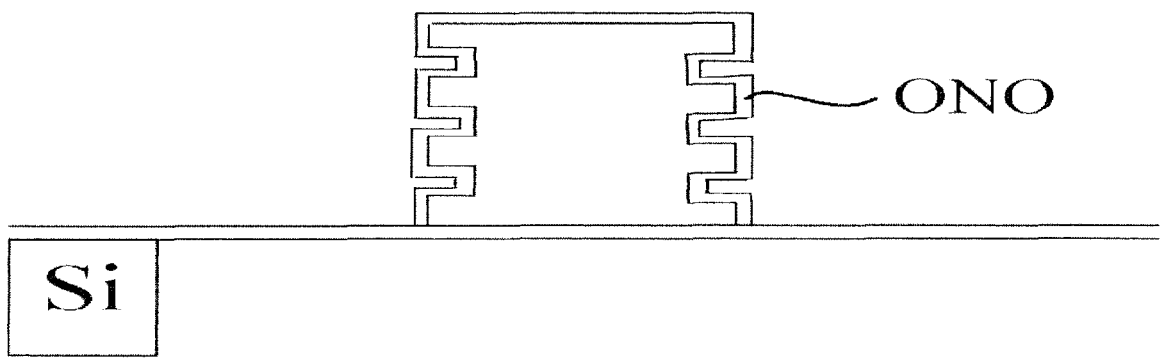

Referring to FIG. 8, an insulating layer such as an ONO (Oxide/Nitride/Oxide) layer is formed.

Figure 9:
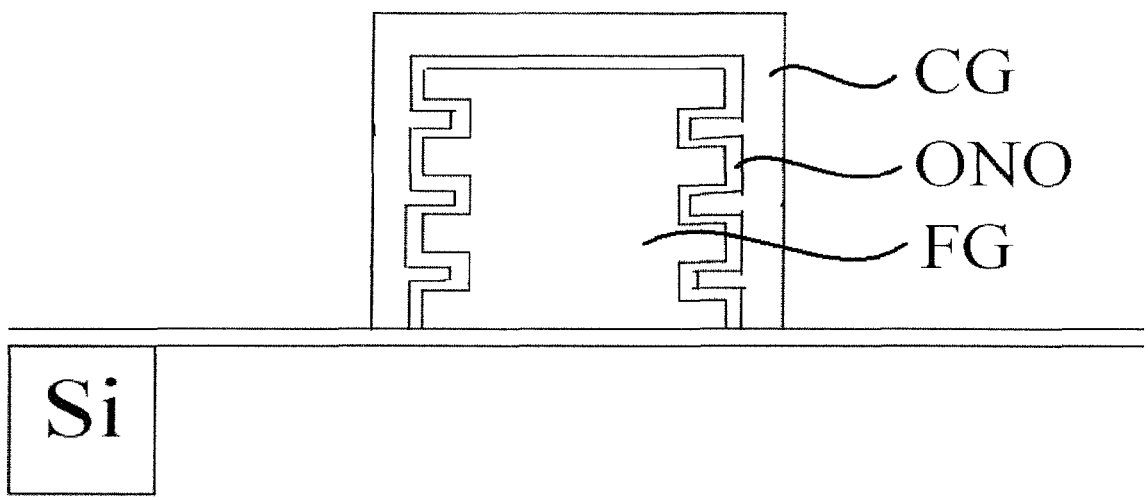

Referring to FIG. 9, a polysilicon layer is deposited on the insulating layer. A control gate is then formed by etching the polysilicon layer.

From the foregoing, persons of ordinary skill in the art will readily appreciate that methods for fabricating a flash memory device have been disclosed. A disclosed example method fabricates a flash memory device with improved electric characteristics and which requires reduced control gate voltage to operate by increasing the coupling ratio. The increase of the coupling ratio is achieved by enlarging the coupling area, (which is one factor determining electrostatic capacitance), by forming convexo-concave (凹凸)shaped sidewalls. The convexo-concave (凹凸)shaped sidewalls are formed due to a difference in the etching rates of doped and undoped polysilicon. To this end, a polysilicon layer is doped into a stack of alternating doped and undoped layers by injecting dopants having various stepped implant energy levels.

Thus, a disclosed method for fabricating a flash memory device comprises: forming a polysilicon layer on a semiconductor substrate, injecting dopants with stepped. implantation energy levels into the polysilicon layer, forming a photoresist pattern on the polysilicon layer, and etching the polysilicon layer to form a floating gate.

It is noted that this patent claims priority from Korean Patent Application Serial Number 10-2003-0052944, which was filed on filed on Jul. 31, 2003, and is hereby incorporated by reference in its entirety.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a flash memory device comprising:
    forming a polysilicon layer on a semiconductor substrate;
    forming a stack of doped and undoped layers in the polysilicon layer,
    forming a photoresist pattern on the polysilicon layer; and
    etching the polysilicon layer of doped and undoped layers to form a floating gate having convexo-concave (凹凸)shaped sidewalls.

2. A method as defined by claim 1, wherein the polysilicon layer is formed over a gate oxide layer formed on the semiconductor substrate.

3. A method as defined by claim 1, further comprising annealing the floating gate to diffuse dopants in the floating gate.

4. A method as defined by claim 3, wherein the annealing is performed after forming the floating gate.

5. A method as defined by claim 1, further comprising forming an insulating layer on the floating gate.

6. A method as defined by claim 5, further comprising:
    forming a polysilicon layer on the insulating layer; and
    etching the polysilicon layer to form a control gate.

7. A method as defined by claim 5, wherein the insulating layer is formed of ONO layer.

* * * * *